US012418097B2

(12) United States Patent
Tang et al.

(10) Patent No.: US 12,418,097 B2
(45) Date of Patent: Sep. 16, 2025

(54) MICROELECTRONIC DEVICE PACKAGE INCLUDING ANTENNA AND SEMICONDUCTOR DEVICE

(71) Applicant: Texas Instruments Incorporated, Dallas, TX (US)

(72) Inventors: Yiqi Tang, Allen, TX (US); Rajen Manicon Murugan, Dallas, TX (US); Juan Alejandro Herbsommer, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/530,179

(22) Filed: Dec. 5, 2023

(65) Prior Publication Data

US 2024/0113413 A1    Apr. 4, 2024

Related U.S. Application Data

(63) Continuation of application No. 17/539,110, filed on Nov. 30, 2021, now Pat. No. 11,837,775.

(60) Provisional application No. 63/177,913, filed on Apr. 21, 2021.

(51) Int. Cl.
  *H01Q 1/22* (2006.01)
  *H01L 23/31* (2006.01)
  *H01L 23/66* (2006.01)
  *H05K 1/02* (2006.01)

(52) U.S. Cl.
  CPC ....... *H01Q 1/2283* (2013.01); *H01L 23/3114* (2013.01); *H01L 23/66* (2013.01); *H05K 1/0237* (2013.01); *H01L 2223/6677* (2013.01)

(58) Field of Classification Search
  CPC . H01Q 11/2283; H01L 23/3114; H01L 23/66; H01L 2223/6677; H05K 1/0237
  USPC ........................................................ 343/878
  See application file for complete search history.

(56) References Cited

U.S. PATENT DOCUMENTS

| 2008/0023810 A1* | 1/2008 | Yamazaki ........ G06K 19/07728 257/679 |
| 2015/0061946 A1* | 3/2015 | Martinez-Ortigosa ..................... H01Q 9/0407 343/713 |
| 2015/0295307 A1 | 10/2015 | Cook et al. |
| 2017/0093010 A1 | 3/2017 | Herbsommer et al. |

(Continued)

FOREIGN PATENT DOCUMENTS

EP          3790048 A1    3/2021

OTHER PUBLICATIONS

PCT Search Report PCT/US2022/02241 mailed Jul. 19, 2022, 4 pgs.

(Continued)

*Primary Examiner* — Peguy Jean Pierre
(74) *Attorney, Agent, or Firm* — Dawn Jos; Frank D. Cimino

(57) ABSTRACT

A described example includes an antenna formed in a first conductor layer on a device side surface of a multilayer package substrate, the multilayer package substrate including conductor layers spaced from one another by dielectric material and coupled to one another by conductive vertical connection layers, the multilayer package substrate having a board side surface opposite the device side surface; and a semiconductor die mounted to the device side surface of the multilayer package substrate spaced from and coupled to the antenna.

20 Claims, 11 Drawing Sheets

(56) References Cited

U.S. PATENT DOCUMENTS

2019/0103653 A1    4/2019  Jeong et al.
2020/0059010 A1*   2/2020  Yang ..................... H01Q 1/48
2020/0274221 A1    8/2020  Suzuki et al.

OTHER PUBLICATIONS

Harchandra et al., "Analysis and Design of Bowtie Antenna with Different Shapes and Structures", International Journal of Engineering Trends and Technology (IJETT), vol. 18, No. 4, pp. 171-175 (Dec. 2014); retrieved from uniform resource locator (url): https://ijettjournal.org/volume-18/number-4/IJETT-V18P234.pdf on Nov. 30, 2021.

* cited by examiner

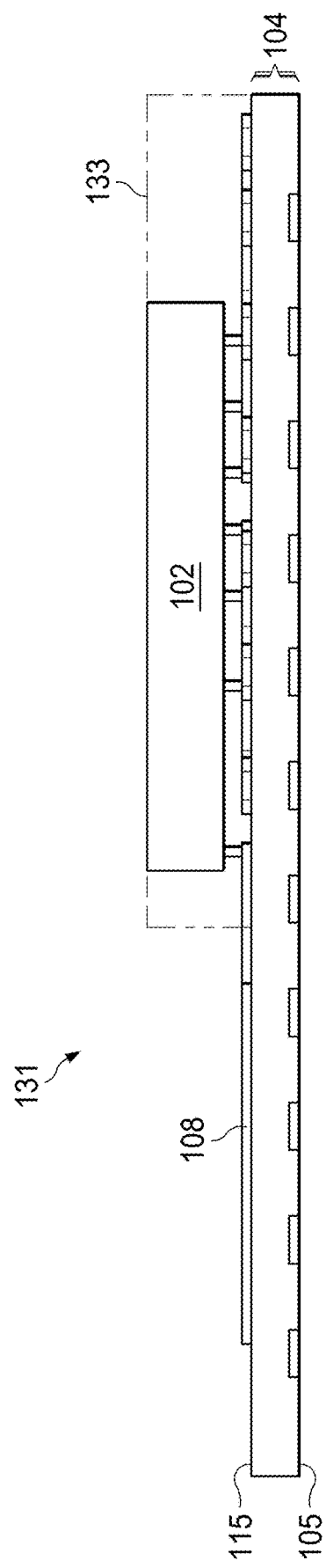
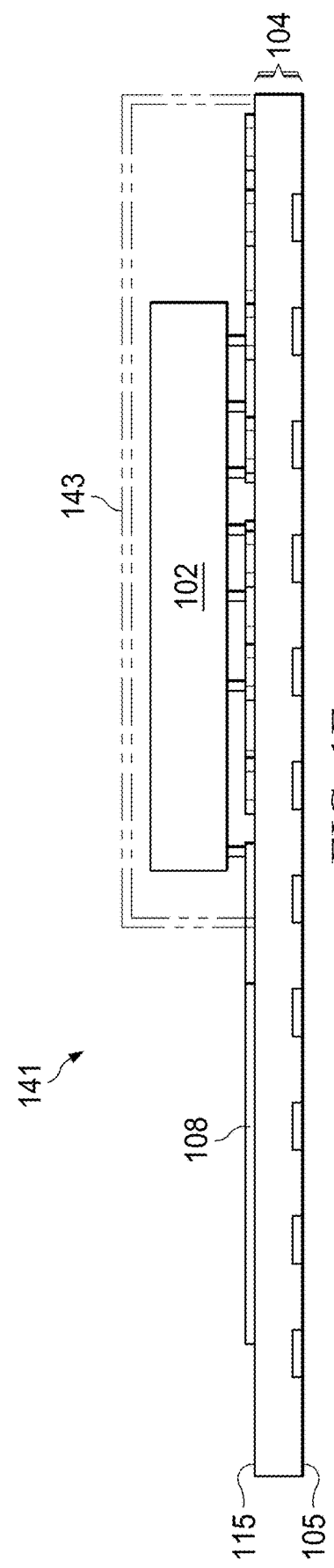
FIG. 1E
FIG. 1F

MICROELECTRONIC DEVICE PACKAGE INCLUDING ANTENNA AND SEMICONDUCTOR DEVICE

CROSS-REFERENCE TO RELATED APPLICATIONS

This application is a continuation of U.S. patent application Ser. No. 17/539,110, filed Nov. 30, 2021, which claims the benefit of and priority to U.S. Provisional Application No. 63/177,913, filed Apr. 21, 2021, which application is hereby incorporated herein by reference in its entirety.

TECHNICAL FIELD

This relates generally to microelectronic device packages, and more particularly to microelectronic device packages including antennas and semiconductor devices.

BACKGROUND

Processes for producing microelectronic device packages include mounting a semiconductor die to a package substrate, and covering the electronic devices with a dielectric material such as a mold compound to form packaged devices.

Incorporating antennas with semiconductor devices in a microelectronic device package is desirable. Antennas are increasingly used with microelectronic devices and portable devices, such as communications systems, communications devices including 4G, 5G or LTE capable cellphones, tablets, and smartphones. Additional applications include microelectronic devices in automotive systems such as radar, navigation and over the air communications systems. Mold compounds used in molded microelectronic devices and some substrate materials used when packaging semiconductor devices have high dielectric constants of about 3 or higher, which can interfere with the efficiency of embedded antennas. Systems using antennas with packaged semiconductor devices therefore often place the antennas on a separate printed circuit board, an organic substrate, spaced from the semiconductor devices. These approaches require additional elements, including expensive printed circuit board (PCB) substrates, which are sometimes used inside a module with semiconductor dies, or sometimes used with packaged semiconductor devices provided spaced apart from the antennas. These solutions are relatively high cost and require substantial device area. Forming microelectronic device packages including efficient and cost effective antennas within the packages remains challenging.

SUMMARY

In a described example, an apparatus includes: an antenna formed in a first conductor layer on a device side surface of a multilayer package substrate, the multilayer package substrate including conductor layers spaced from one another by dielectric material and coupled to one another by conductive vertical connection layers, the multilayer package substrate having a board side surface opposite the device side surface; and a semiconductor die mounted to the device side surface of the multilayer package substrate spaced from and coupled to the antenna.

In another described example, a microelectronic device package includes: a multilayer package substrate with conductor layers spaced from one another by dielectric material, and including vertical connection layers extending through the dielectric material between the conductor layers and coupling portions of the conductor layers one to another, the multilayer package substrate having a device side surface and an opposite board side surface; a bowtie antenna formed in a first one of the conductor layer at the device side surface of the multilayer package substrate; a reflector formed in another one of the conductor layers of the multilayer package substrate and spaced from the bowtie antenna by the dielectric material; and a semiconductor die mounted to the device side surface of the multilayer package substrate and coupled to the bowtie antenna.

In a further described example, a method includes: forming an antenna in a first conductor layer on a device side surface of a multilayer package substrate, the multilayer package substrate including conductor layers spaced from one another by dielectric material and vertical connection layers extending through the dielectric material between the conductor layers and coupling portions of the conductor layers to one another, the multilayer package substrate having a board side surface opposite the device side surface; forming a reflector in another conductor layer of the multilayer package substrate, the reflector aligned with the antenna and spaced from the antenna by the dielectric material; and mounting a semiconductor die on the device side surface of the multilayer package substrate, the semiconductor die coupled to the antenna.

BRIEF DESCRIPTION OF THE DRAWINGS

FIGS. 1E-1F illustrate in cross sectional views additional alternative arrangements.

DETAILED DESCRIPTION

Figure 1A:
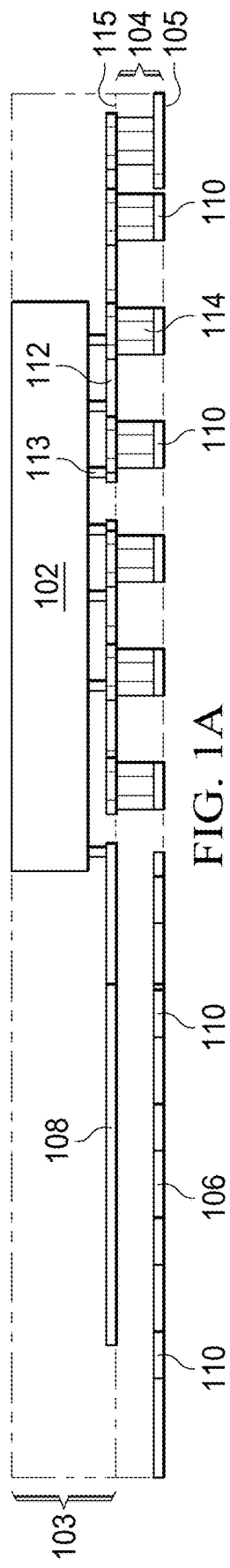
FIGS. 1A-1C illustrate, in a cross sectional view, a projection view, and a plan view, respectively, an arrangement in a no lead package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. A semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, sensors, or active devices such as transistors. The semiconductor die can be an integrated circuit with hundreds or thousands of transistors coupled to form a functional circuit, for example a microprocessor or memory device.

The term "microelectronic device package" is used herein. A microelectronic device package has at least one semiconductor die electrically coupled to terminals, and has a package body that protects and covers the semiconductor die. The microelectronic device package can include additional elements, in some arrangements an integrated antenna is included. Passive components such as capacitors, resistors, and inductors or coils can be included. In some arrangements, multiple semiconductor dies can be packaged together. For example, a power metal oxide semiconductor (MOS) field effect transistor (FET) semiconductor die and a logic semiconductor die (such as a gate driver die or a controller die) can be packaged together to from a single packaged electronic device. The semiconductor die is mounted to a package substrate that provides conductive leads, a portion of the conductive leads form the terminals for the packaged device. The semiconductor die can be mounted to the package substrate with a device side surface facing away from the substrate and a backside surface facing and mounted to a die pad of the package substrate. In wire bonded semiconductor device packages, bond wires couple conductive leads of a package substrate to bond pads on the semiconductor die. The semiconductor device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions provide the terminals for the semiconductor device package.

The term "package substrate" is used herein. A package substrate is a substrate arranged to receive a semiconductor die and to support the semiconductor die in a completed semiconductor device package. Package substrates useful with the arrangements include conductive lead frames, which can be formed from copper, aluminum, stainless steel, steel and alloys such as Alloy 42 and copper alloys. The lead frames can include a die pad with a die side surface for mounting a semiconductor die, and conductive leads arranged near and spaced from the die pad for coupling to bond pads on the semiconductor die using wire bonds, ribbon bonds, or other conductors. The lead frames can be provided in strips or arrays. The conductive lead frames can be provided as a panel with strips or arrays of unit device portions in rows and columns. Semiconductor dies can be placed on respective unit device portions within the strips or arrays. A semiconductor die can be placed on a die pad for each packaged device, and die attach or die adhesive can be used to mount the semiconductor dies to the lead frame die pads. In wire bonded packages, bond wires can couple bond pads on the semiconductor dies to the leads of the lead frames. The lead frames may have plated portions in areas designated for wire bonding, for example silver plating can be used. After the bond wires are in place, a portion of the package substrate, the semiconductor die, and at least a portion of the die pad can be covered with a protective material such as a mold compound.

The term "multilevel package substrate" is used herein. A multilevel package substrate is a substrate that has multiple conductor levels including conductive traces, and which has vertical conductive connections extending through the dielectric material between the conductor levels. In an example arrangement, a routable lead frame (RLF) is formed by plating a patterned conductor level and then covering the conductor with a layer of dielectric material. Grinding can be performed on the dielectric material to expose portions of the layer of conductors. Additional plating layers can be formed to add additional levels of conductors, some of which are coupled to the prior layers by vertical connectors, and additional dielectric material can be deposited at each level and can cover the conductors. By using an additive or build up manufacturing approach, and by performing multiple plating steps, molding steps, and grinding steps, a multilayer package substrate is formed with an arbitrary number of layers. In an example arrangement, copper conductors are formed by plating, and a thermoplastic material can be used as the dielectric material.

In packaging microelectronic and semiconductor devices, mold compound may be used to partially cover a package substrate, to cover components, to cover a semiconductor die, and to cover the electrical connections from the semiconductor die to the package substrate. This molding process can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state and then molding can be performed by pressing the liquid mold compound into a mold through runners or channels. Transfer molding can be used. Unit molds shaped to surround an individual device may be used, or block molding may be used, to form multiple packages simultaneously for several devices from mold compound. The devices to be molded can be provided in an array or matrix of several, hundreds or even thousands of devices in rows and columns that are then molded together.

After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and the saw will traverse the molded electronic devices in two different directions to cut apart the packaged electronic devices from one another in the array.

The term quad flat no-lead (QFN) is used herein for a type of electronic device package. A QFN package has conductive leads that are coextensive with the sides of a molded package body, and in a quad package the leads are on four sides. Alternative flat no-lead packages may have leads on two sides or only on one side. These can be referred to as small outline no-lead or SON packages. No-lead packaged electronic devices can be surface mounted to a board. Leaded packages can be used with the arrangements where the leads extend away from the package body and are shaped to form a portion for soldering to a board. A dual in line package (DIP) can be used with the arrangements. A small outline package (SOP) can be used with the arrangements. Small outline no-lead (SON) packages can be used, and a small outline transistor (SOT) package is a leaded package that can be used with the arrangements. Leads for leaded packages are arranged for solder mounting to a board. The leads can be shaped to extend towards the board, and form a mounting surface. Gull wing leads, J-leads, and other lead shapes can be used. In a DIP package, the leads end in pin shaped portions that can be inserted into conductive holes formed in a circuit board, and solder is used to couple the leads to the conductors within the holes.

In the arrangements, a microelectronic device package includes a semiconductor die mounted to a multilayer package substrate. The multilayer package substrate has a device side surface, a semiconductor die mounted on a portion of the device side surface, and an antenna formed spaced from the die portion. In an example arrangement the semiconductor die will be mounted beside, or side by side, with respect to an antenna formed on the device side surface. In the multilayer package substrate, the antenna can be formed in a conductive layer at or near the device side surface of the multilayer package substrate, for example as a patterned plated conductor layer of the multilayer package substrate. Another layer of the multilayer package substrate can have a reflector patterned in a conductor beneath the antenna pattern, to increase efficient transmission by the antenna by reflecting radiated energy back towards the antenna and away from the device side surface of the multilayer package substrate. A semiconductor die mounted to the device side surface of the multilayer package substrate can be coupled to the antenna by conductive traces formed in conductor layers of the multilayer package substrate. In one example, the semiconductor die is flip chip mounted to the multilayer package substrate. In an alternative example, a semiconductor die mounted facing away from the device side surface of the multilayer package substrate and is wire bonded to conductive traces on the multilayer package substrate.

In an example arrangement, an antenna is configured to operate in the rectangular waveguide 5 (WR5) frequency range, between 140 GHz and 220 GHz. In other examples, the antenna can be configured to operate in the millimeter wave range between 30 GHz and 300 GHz, with signals having wavelengths in air between 10 millimeters and 1 millimeters. Other frequency signals such as RF signals can be transmitted or received by the antenna. In one example arrangement, the antenna is a bowtie antenna. In the arrangements, a planar layer of conductor in the multilayer package substrate is patterned to form an antenna, and a planar reflector, spaced from the antenna by dielectric material, is formed to reflect radiated energy from the antenna back to the antenna, to increase the transmitted energy from the antenna.

The semiconductor die used in the arrangements can be a monolithic millimeter wave integrated circuit (MMIC). The MMIC can be a transmitter, receiver, transceiver, or a component in a system for transmitting or receiving signals such as an amplifier, encoder, filter, or decoder. The semiconductor die can be provided as multiple semiconductor dies or as components mounted to the multilayer package substrate, to form a system. Additional passive components can be mounted to the multilayer package substrate.

FIGS. 1A-1F illustrate example arrangements. FIG. 1A illustrates, in a cross sectional view, a microelectronic device package 100, in an example arrangement using a quad flat no lead (QFN) package. QFN packages are one type of package that is useful with the arrangements. Other package types including leaded and other no lead packages can be used. The microelectronic device package 100 includes a multilayer package substrate 104. Terminals 110 are formed of a conductor material on a board side surface 105 (the bottom surface as the arrangement is oriented in FIG. 1A) of the microelectronic device package 100. Vertical connectors 114 extend from terminals 110 through layers of dielectric material of the multilayer package substrate 104 to a device side surface 115 of the multilayer package substrate 104, where leads 112 are formed of conductors of a conductive layer of the multilayer package substrate. A semiconductor die 102 is mounted to the device side surface 115 of the multilayer package substrate 104. The semiconductor die 102 in the illustrated example is flip chip mounted, so that an active surface of the semiconductor die 102 is oriented facing the device side surface of the multilayer package substrate 104. Conductive post connects 113 extend from the semiconductor die 102 to leads 112 and make electrical connections between semiconductor die 102 and multilayer package substrate 104.

An antenna 108 is formed of a first conductor layer on the device side surface 115 of the multilayer package substrate 104. The antenna 108 is coupled to the semiconductor die 102 by conductive post connects 113 mounted to leads 112. The device side surface 115 of the multilayer package substrate 104 and the semiconductor die 102 are covered with mold compound 103. A reflector 106 is formed in another conductor layer of the multilayer package substrate 104, and is positioned beneath the antenna 108 (as the elements are oriented in FIG. 1A), and in a conductor layer that is formed closer to or at the board side surface 105 of the multilayer package substrate 104. The reflector 106 is aligned with and spaced from the antenna 108 by the dielectric material of the multilayer package substrate 104.

Figure 1D:
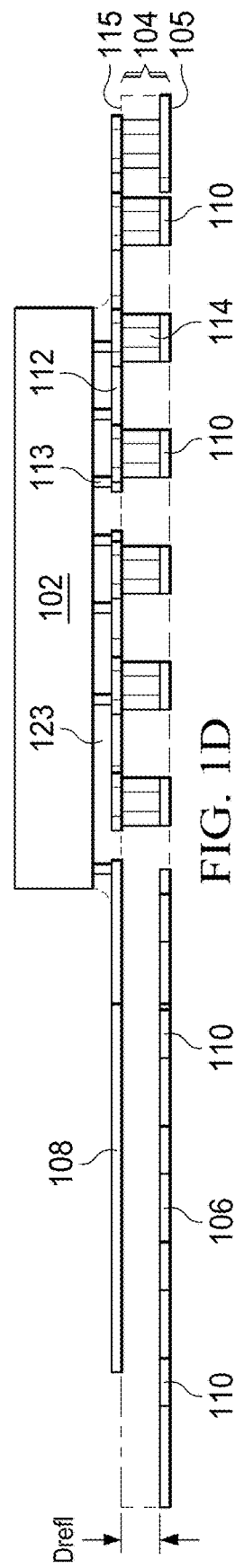
FIG. 1D illustrates in a cross sectional view an alternative arrangement.
Figure 1B:
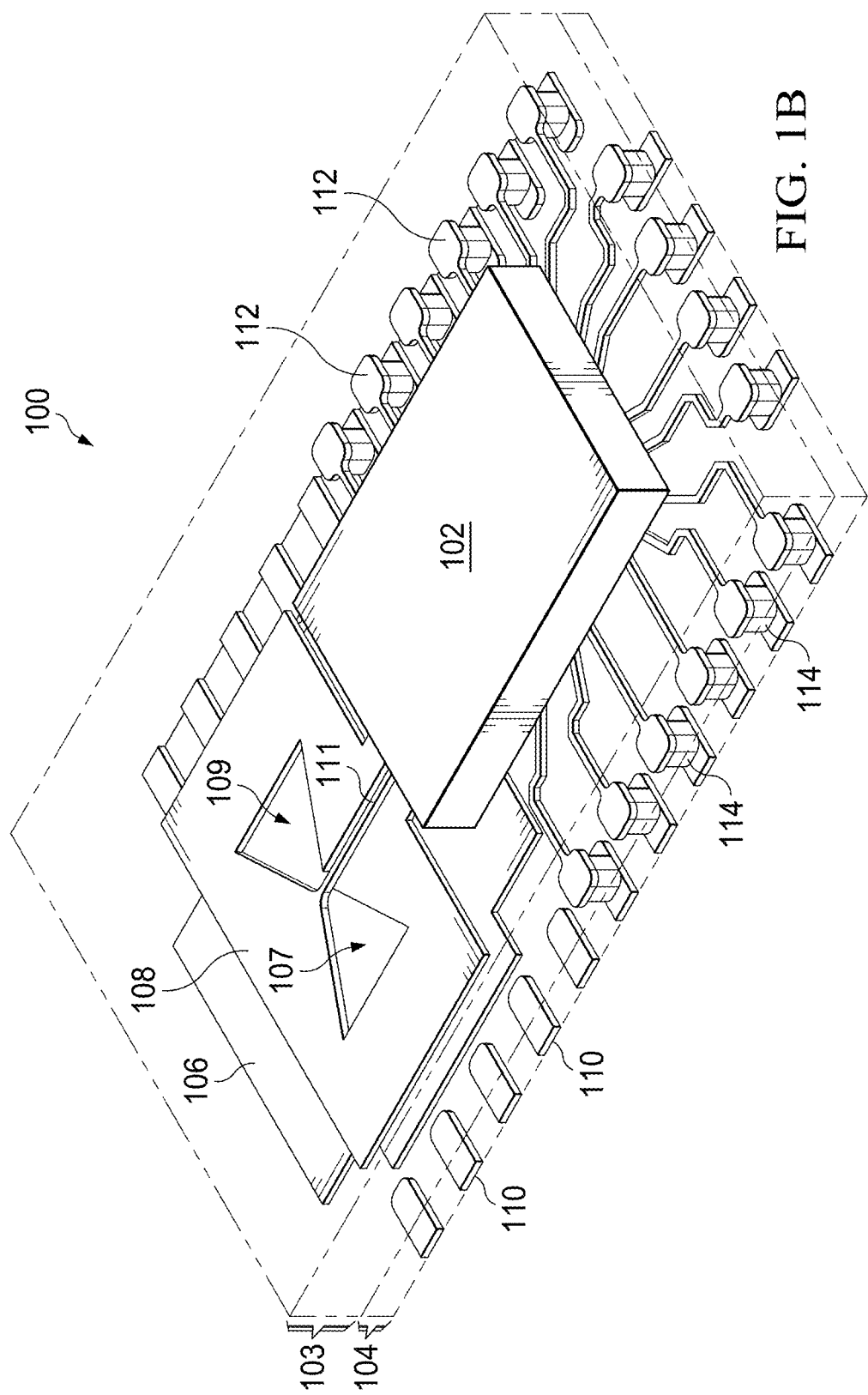

In FIG. 1B, the microelectronic device package 100 is illustrated in a projection view and includes mold compound 103 covering the device side surface 115 of the multilayer package substrate 104, and surrounding and protecting the semiconductor die 102 and the device side surface of the multilayer package substrate 104. Terminals 110 on the board side surface 105 are configured for mounting to a system board, for example a printed circuit board. Leads 112 are formed on the device side surface 115 of the multilayer package substrate 104 can be formed of the same material as antenna 108, for example, copper, gold, aluminum, silver, or an alloy of these. Protective plating layers such as palladium, nickel, gold or multiple layers of these can be form on the antenna 108. In the illustrated example of FIG. 1B, semiconductor die 102 is flip chip mounted to the device side surface 115 of the multilayer package substrate 104, and has conductive post connects (not visible in FIG. 1B, see FIG. 1A) extending from an active surface of the semiconductor die 102 bonded to the device side surface of the multilayer package substrate 104. Mold compound or other protective material 103 is shown overlying the antenna 108 and surrounding the semiconductor device 102, in an alternative arrangement the mold compound 103 can cover the semiconductor device 102. In the arrangement illustrated in FIGS. 1A-1C, antenna 108 is covered by the mold compound 103, and signals radiated from or received by the antenna 108 traverse the mold compound 103.

FIG. 1B illustrates the microelectronic device package 100 with the antenna 108 formed on the device side surface of the multilayer package substrate 104 in a conductor layer. The semiconductor die 102 is shown mounted on the device side surface of the multilayer package substrate 104 in a side by side orientation with respect to the antenna 108. Although not shown in the illustration for simplicity of explanation, additional components such as passives or additional semiconductor devices can be mounted to the device side surface of the multilayer package substrate 104. Leads 112 are formed on the device side surface of the multilayer package substrate 104 and couple the semiconductor die 102 to vertical connectors 114, which are conductors formed of the intervening conductive layers of the multilayer package substrate 104 that extend through dielectric material to the terminals 110. The reflector 106 is formed beneath and aligned with the antenna 108. Antenna 108 is formed in a first conductor layer, and reflector 106 is formed in another conductor layer of the multilayer package substrate 104, and can be on the board side surface (the lowest conductor level) or can be at another conductor level of the multilayer package substrate 104, depending on the number of conductor levels in the multilayer package substrate 104.

The example antenna 108 in FIG. 1B is a bowtie antenna, with two triangle shaped bows, a first bow 107 and a second bow 109 oriented in opposite directions, and spaced from each other. The first and second bows 107, 109 are formed as openings in the first conductor layer of the multilayer substrate 104, and are coupled to a feed input 111, in this example a coplanar waveguide (CPW) that is also formed in the conductor layer. In an alternative arrangement, additional antenna shapes can be used. In yet another alternative arrangement, additional bows can be formed to increase the gain of the bowtie antenna 108. The antenna 108 can be formed of the first conductor layer on the device side of the multilayer package substrate 104, for example antenna 108 can be formed of copper or gold or alloys. Other conductive materials compatible with plating processes can be used, including silver and aluminum. The reflector 106 is formed in another conductor layer of the multilayer package substrate 104, and can be formed of the same material or another conductor material, for example reflector 106 can be formed of copper or gold. The dielectric material of the multilayer package substrate 104 can be a thermoplastic or a thermoset material. An example thermoplastic material is ABS (Acrylonitrile Butadiene Styrene). Alternative dielectric materials include thermoplastics such as ASA (Acrylonitrile Styrene Acrylate), thermoset mold compound including epoxy resin, epoxies, resins, or plastics. A mold compound 103 is shown overlying the antenna 108, and protecting the semiconductor device 102. Mold compound 103 can be a thermoset mold compound of epoxy resin, another epoxy, a resin, or plastic.

Figure 1C:
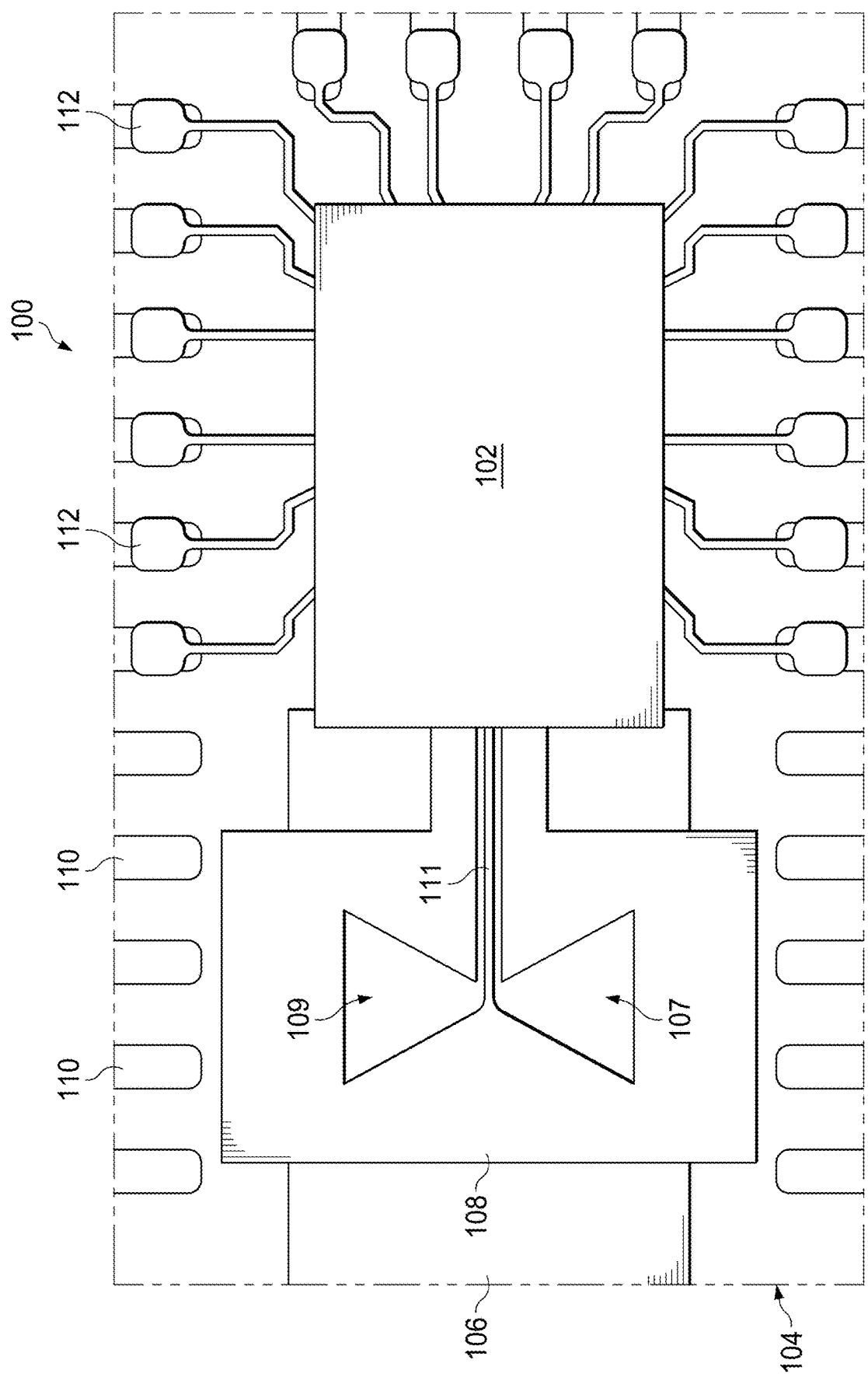

FIG. 1C illustrates the microelectronic device package 100 in a plan or top view. In FIG. 1C, the microelectronic device package 100 includes multilayer package substrate 104, with antenna 108 formed in the first conductor layer on a device side surface, and reflector 106 formed in another conductor layer beneath and spaced from the antenna 108. Terminals 110 on the board side surface are configured for mounting to a system board, for example for surface mounting to a printed circuit board. Leads 112 are formed on the device side surface of the multilayer package substrate 104 can be formed of the same material as antenna 108, for example, copper or gold or an alloy of these. Semiconductor die 102 is flip chip mounted to the device side surface of the multilayer package substrate 104, and has conductive post connects (not visible in FIG. 1C, see 113 in FIG. 1A) extending from an active surface of the semiconductor die 102 configured for bonding to the device side surface of the multilayer package substrate 104. In the arrangement of FIGS. 1A-1C, the antenna 108 is covered by a mold compound 103, and signals radiated from the antenna 108 must traverse the mold compound 103.

The arrangement shown in FIGS. 1A-1C can be formed using additive manufacturing, or build up processing, to form the multilayer package substrate including the antenna 108 and the reflector 106. As is further described below, by using a series of plating, molding, and grinding steps, successive layers of trace level conductors, vertical connections, and dielectric can be formed, and these steps can be repeated to form the multilayer package substrate. The antenna 108 can be formed by forming a pattern on a rectangular portion of the first conductor layer. Because the vertical connections are formed using an additive process, and then dielectric material is molded over the vertical connections, the need for drilling precise via holes, and the need to plate or fill the via holes with conductors, is eliminated, so the multilayer package substrate is cost effective (when compared to organic substrates such as printed circuit boards.) By mounting the semiconductor die on the multilayer package substrate spaced from and coupled to the antenna using existing flip chip or wire bonding connections, a reliable and cost effective microelectronic device package including an antenna is provided by use of the arrangements.

FIG. 1D illustrates an alternative arrangement for a microelectronic device package 101 in a cross section. The multilayer package substrate 104 is configured as in FIGS. 1A-1C, and the antenna 108 is formed in the first conductor layer on a device side surface 115 of the multilayer package substrate 104. The reflector 106 is formed in another conductor layer nearer to, or on the board side surface of the multilayer package substrate 104, and spaced from the antenna 108. The semiconductor die 102 is shown flip chip mounted to the device side surface 115 of the multilayer package substrate 104. Underfill material 123 such as a resin or epoxy, or a glob top mold compound which is applied as a gel or liquid, can be flowed beneath the semiconductor die 102 after mounting the semiconductor die 102, to protect the post connects 113 and solder connections to leads 112.

Comparing the arrangements of FIG. 1D and FIGS. 1A-1C, in FIG. 1D the mold compound (see 103 in FIGS. 1A-1B) is not provided over the device side surface of the multilayer package substrate, so that the antenna 108 has a surface exposed to air. In this arrangement, signals radiated from the antenna 108 do not traverse the mold compound (see 103 in FIG. 1A) and are instead transmitted in air.

FIG. 1D also illustrates a spacing distance labeled Drefl between the antenna 108 and the reflector 106. In the arrangements, the antenna (108 in FIG. 1D) is configured to radiate signals upwards away from the device side surface of the multilayer package substrate 104. When energy is applied to the antenna 108, the energy radiates in all directions, including through the multilayer substrate 104 towards the reflector 106. Because as the signal energy travels, the phase shifts, and because the reflector 106 will cause a λ/2 phase shift, where λ is the wavelength of the signal, the distance Drefl can be adjusted to be approximately λ/4, so that the energy transmitted to the reflector, reflected by the reflector, and returned to the antenna 108 traverses a phase shift of λ/4+λ/2+λ/4, or λ, and the reflected energy from reflector 106 arrives at the antenna 108 in phase with the energy being transmitted upwards from the antenna 108, adding to the gain of the signal using of constructive interference. By using different layers of the multilayer package substrate 104 to form the reflector 106, the distance Drefl can be altered so as to increase the efficiency of the antenna 108 and reflector 106. This same alteration can be used with any of the arrangements. The thickness of the multilayer package substrate 104 can be varied to vary the distance Drefl. Note that the wavelength λ in the multilayer package substrate differs from the wavelength in air because it depends on the dielectric constant of the material the signal is traversing, simulation of the signal propagation in the selected dielectric material can be used to determine the proper spacing distance Drefl.

FIGS. 1E and 1F illustrate, in cross sections, additional arrangements based on the arrangement of FIG. 1D. Note that in both FIGS. 1E and 1F, certain elements are not shown for simplicity of illustration, for example the reflector 106 is not shown in FIGS. 1E-1F, however it is present in these arrangements. In FIG. 1E, an arrangement for a microelectronic device package 131 with antenna 108 includes mold compound 133 selectively formed over a portion of the device side surface 115 of the multilayer package substrate 104.

In FIG. 1E, mold compound 133 covers the semiconductor die 102, and a portion of the multilayer package substrate 104, but does not cover the antenna 108, so that energy transmitted from or received by the antenna 108 traverses only air, and does not traverse the mold compound 133. The mold compound 133 can be selectively formed over a portion of the multilayer package substrate 104 using film assisted transfer molding, where a film is used to line a mold tool, and the film and mold tool are configured to contain the mold compound transferred into the mold around the semiconductor die 102, and leaving the antenna 108 without mold compound formed over it, so that signals from the antenna 108 are radiated into the air, and do not traverse any part of mold compound 133.

In FIG. 1F, an alternative arrangement for a microelectronic device package 141 includes a metallic or ceramic shield 143 formed around the semiconductor die 102, and covering a portion of the device side surface 115 of the multilayer package substrate 104, but not covering the antenna 108, which is configured to radiate electromagnetic energy into the air. The shield 143 can be a mesh or grid and may be arranged as a Faraday cage or electronic field shield, to reduce noise or unwanted coupling between the antenna 108 and the semiconductor device 102.

In the arrangements, a semiconductor device is mounted to a device side surface of a multilayer package substrate. In forming the arrangements, the semiconductor devices can be formed independently of the multilayer package substrate, so that methods for forming the semiconductor device, and the multilayer package substrate, can be performed at different times, and at different locations, then the components can be assembled together to complete the arrangements.

Figure 2A:
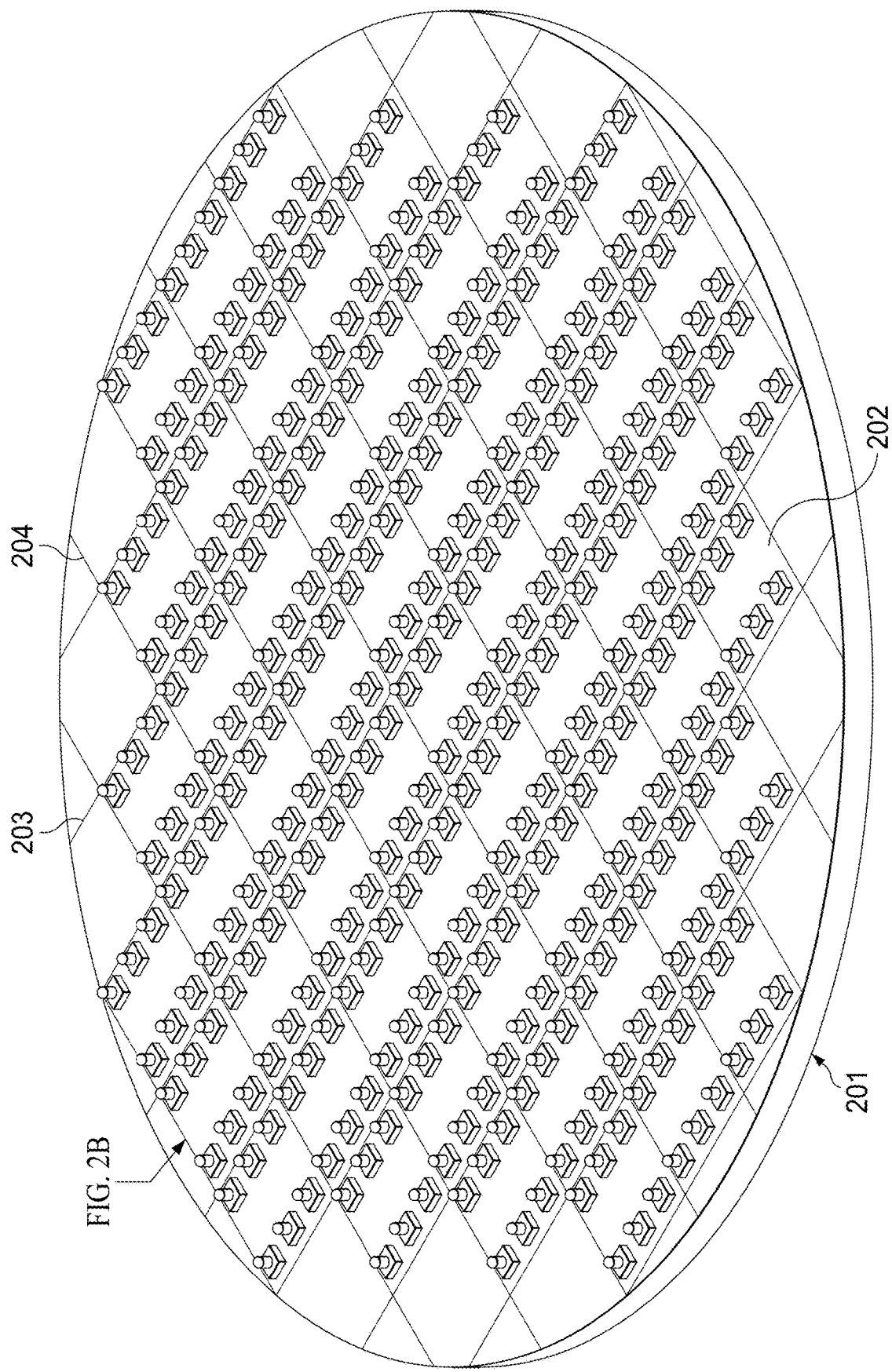
FIGS. 2A-2B illustrate, in a projection view and a close up projection view, respectively, semiconductor dies on a semiconductor wafer and an individual semiconductor die from the semiconductor wafer for use with the arrangements.
Figure 2B:
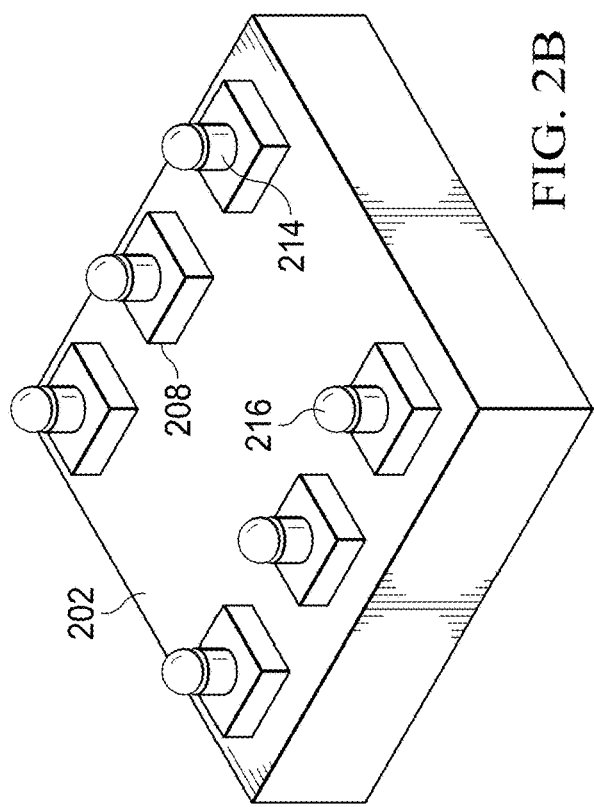

FIGS. 2A and 2B illustrate in two projection views a semiconductor wafer having semiconductor devices formed on it and configured for flip chip mounting, and an individual semiconductor die for flip chip mounting, respectively. In FIG. 2A, a semiconductor wafer 201 is shown with an array of semiconductor dies 202 formed in rows and columns on a surface. The semiconductor dies 202 can be formed using processes in a semiconductor manufacturing facility, including ion implantation, doping, anneals, oxidation, dielectric and metal deposition, photolithography, pattern, etch, chemical mechanical polishing (CMP), electroplating, and other processes for making semiconductor devices. Scribe lanes 203 and 204, which are perpendicular to one another and which run in parallel groups across the wafer 201, separate the rows and columns of the completed semiconductor dies 202, and provide areas for dicing the wafer to separate the semiconductor dies 202 from one another.

FIG. 2B illustrates a single semiconductor die 202, with bond pads 208, which are conductive pads that are electrically coupled to devices (not shown) formed in the semiconductor die 202. Conductive post connects 214 are shown extending away from a proximate end mounted on the bond pads 208 on the surface of semiconductor die 202 to a distal end, and solder bumps 216 are formed on the distal ends of the conductive post connects 214. The conductive post connects 214 can be formed by electroless plating or electroplating. In an example, the conductive post connects 214 are copper pillar bumps. Copper pillar bumps can be formed by sputtering a seed layer over the surface of the semiconductor wafer 201, forming a photoresist layer over the seed layer, using photolithography to expose the bond pads 2108 in openings in the layer of photoresist, plating the copper conductive post connects 214 on the bond pads, and plating a lead solder or a lead-free solder such as an tin, silver (SnAg) or tin, silver, copper (SnAgCu) or SAC solder to form solder bumps 116 on the copper conductive post connects 214. In alternative approach, solder bumps or particles may be dropped onto the distal ends of the copper pillar bumps and then reflowed in a thermal process to form bumps. Other conductive materials can be used for the conductive post connects in an electroplating or electroless plating operation, including gold, silver, nickel, palladium, or tin, for example. Not shown for clarity of illustration are under bump metallization (UBM) portions which can be formed over the bond pads to improve plating and adhesion between the conductive post connects 214 and the bond pads 208. After the plating operations, the photoresist is then stripped, and the excess seed layer is etched from the surface of the wafer. The semiconductor dies 202 are then separated by dicing, or are singulated, using the scribe lanes 203, 204 (see FIG. 2A).

Figure 3:
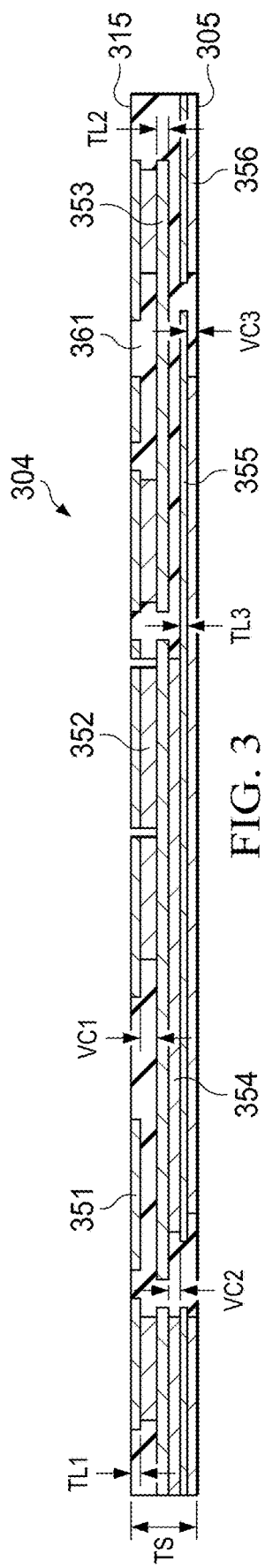
FIG. 3 illustrates, in a cross sectional view, a multilayer package substrate for use with the arrangements.

FIG. 3 illustrates in a cross sectional view a multilayer package substrate 304 that can be used with the arrangements. In FIG. 3, the multilayer package substrate 304 has a device side surface 315 and a board side surface 305. Three trace layers 351, 353, 355 are formed spaced from one another by dielectric material, the trace layers are patterned for making horizontal connections, and three vertical conductor layers 352, 354, 356 form electrical connections between the three trace layers 351, 353, 355 and extend through the dielectric material 361 that is disposed over and between the trace layers. The dielectric material 361 can be a thermoplastic material such as ABS, or ASA, or can be a thermoset material, such as epoxy resin mold compound.

In one example the multilayer package substrate 304 has a substrate thickness labeled TS of 200 microns. The first trace layer, 351, near the device side surface 315 of the multilayer package substrate, has a trace layer thickness TL1 of 15 microns. The first vertical conductor layer, 352, has a thickness VC1 of 25 microns. The second trace layer, 353, sometimes coupled to the first trace layer by the first vertical connection layer 351, has a thickness labeled TL2 of 60 microns. The second vertical connection layer, 354, has a thickness labeled VC2 of 65 microns. The third trace layer, 355, has a thickness labeled TL3 of 15 microns, and the third vertical connection layer, 356, has a thickness labeled VC3 of 25 microns. Additional layers, such as conductive lands on the device side surface 315, or terminals on the board side surface 305, may be formed by plating (not shown in FIG. 3). A continuous vertical connection between the device side surface 315 and the board side surface 305 can be formed by patterning a stack of trace layers and the corresponding vertical connection layers to form a continuous conductive path extending through the dielectric material 361. In the arrangements, an antenna can be formed by patterning the first trace layer 351, while a reflector can be formed by patterning the third trace layer 355, for example. A semiconductor device mounting area positioned spaced from the antenna, as described above, can be formed by patterning the first trace layer 351. Note that in this description, the vertical connection layers 352, 354, and 356 are not described as "vias" to distinguish the vertical connections of the arrangements from the vertical connections of PCBs or other substrates, which are filled via holes. The vertical connections of the arrangements are formed using additive manufacturing, while vias in PCBs are usually formed by removing material, for example via holes are drilled into the substrate. These via holes between conductor layers then must be plated and filled with a conductor, which requires additional plating steps after the drilling steps. These additional steps are precise manufacturing processes that add costs and require additional manufacturing tools and capabilities. In contrast the vertical connection layers used in the multilayer package substrates of the arrangements are formed in the same plating processes as forming the trace layers, simplifying manufacture, and reducing costs. In addition the vertical connection layers in the arrangements can be arbitrary shapes, such as rails, columns, or posts, and the rails can be formed in continuous patterns to form electric shields, tubs, or tanks, and can be coupled to grounds or other potentials, isolating regions of the multilayer package substrate from one another. Noise reduction and the ability to create electrically isolated portions of the multilayer package substrate can be enhanced by use of the vertical connections to form tanks, shields, and tubs. Thermal performance of the microelectronic device packages of example arrangements can be improved by use of the vertical connection layers to form thermally conductive columns, sinks or rails that can be coupled to thermal paths on a system board to increase thermal dissipation from the semiconductor devices mounted on the multilayer package substrate.

Figure 4A:
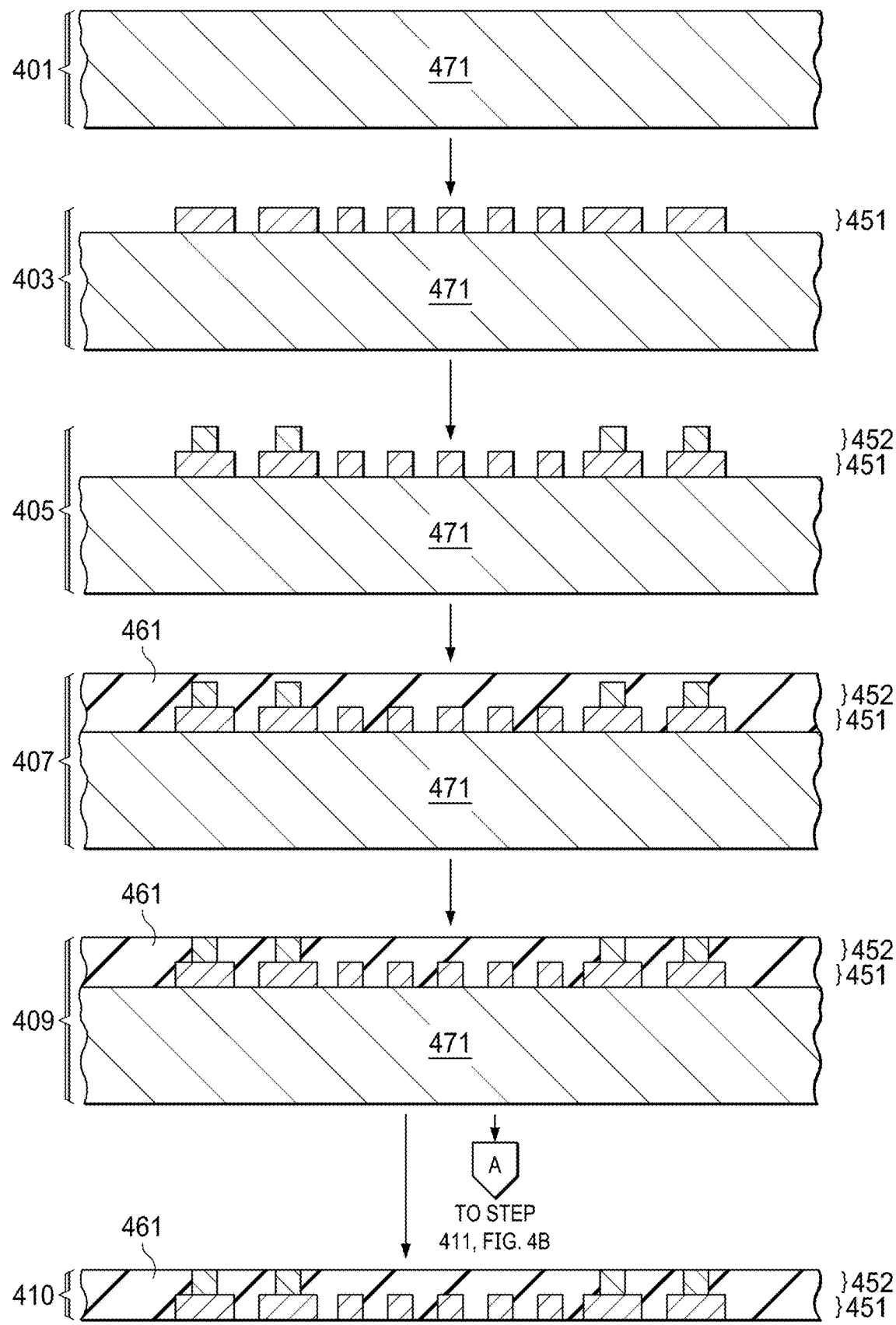
FIGS. 4A-4B illustrate, in a series of cross sectional views, the major steps in manufacturing a multilayer package substrate that can be used in the arrangements.
Figure 4B:
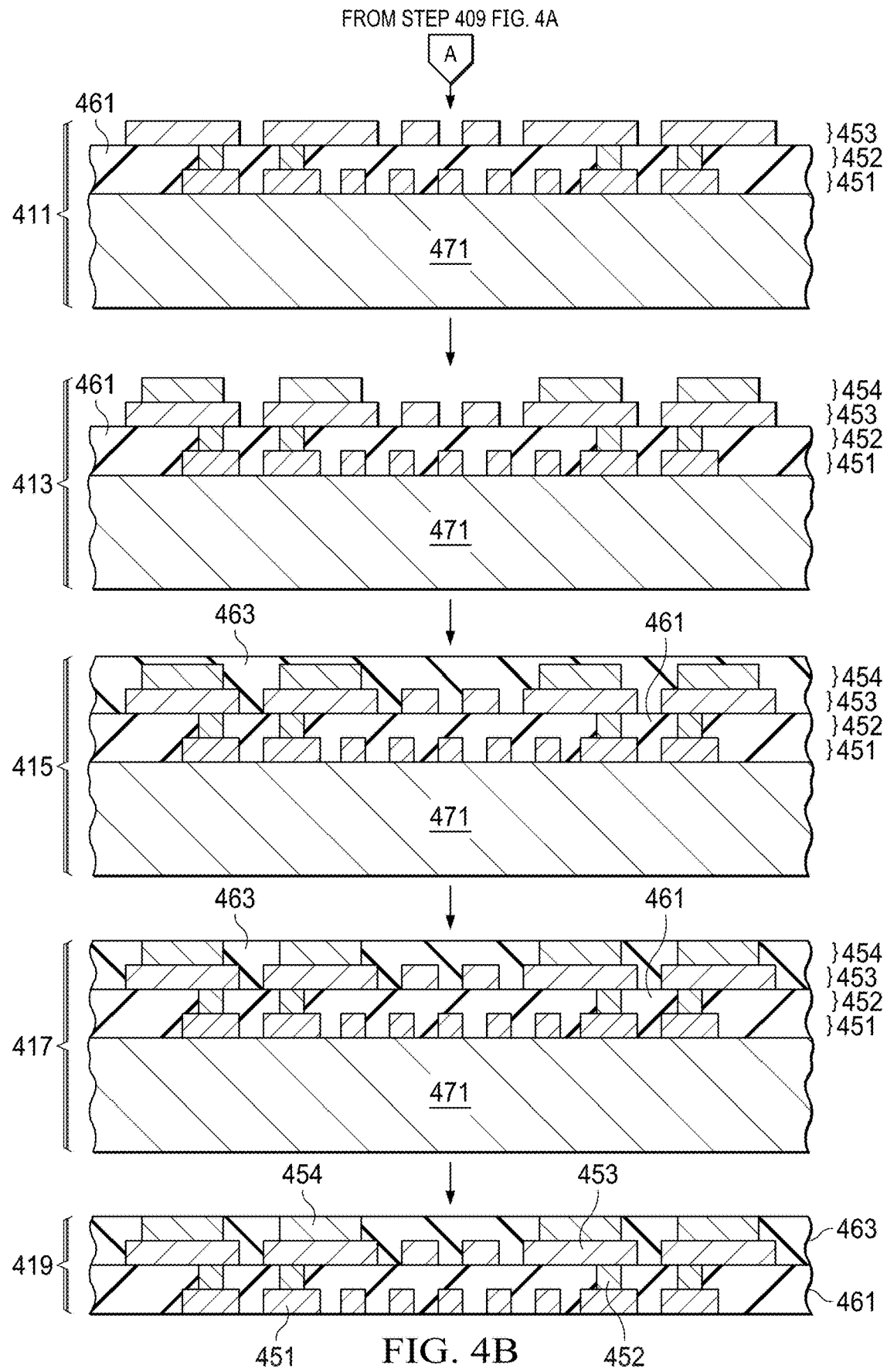

FIGS. 4A-4B illustrate, in a series of cross sectional views, selected steps for a method for forming a multilayer package substrate that is useful with the arrangements. In FIG. 4A, at step 401, a metal carrier 471 is readied for a plating process. The metal carrier 471 can be stainless steel, steel, aluminum or another metal that will support the multilayer package substrate layers during plating and molding steps, the multilayer package substrate is then removed, and the metal carrier is cleaned for additional manufacturing processes.

At step 403, a first trace layer 451 is formed by plating. In an example process, a seed layer is deposited over the surface of the metal carrier 471, by sputtering, chemical vapor deposition (CVD) or other deposition step. A photoresist layer is deposited over the seed layer, exposed, developed and cured to form a pattern to be plated. Electroless or electroplating is performed using the exposed portions of the seed layer to start the plating, forming a pattern according to patterns in the photoresist layer.

At step 405, then plating process continues. A second photoresist layer is deposited, exposed, and developed to pattern the first vertical connection layer 452. By leaving the first photoresist layer in place, the second photoresist layer is used without an intervening strip and clean step, to simplify processing. The first trace layer 451 can be used as a seed layer for the second plating operation, to further simplify processing.

At step 407, a first molding operation is performed. The first trace layer 451 and the first vertical connection layer 452 are covered in a dielectric material. In an example a thermoplastic material is used, in a particular example ABS is used; in alternative examples ASA can be used, or a thermoset epoxy resin mold compound can be used, or resins, epoxies, or plastics can be used. In an example compressive molding operation, a mold compound can be heated to a liquid state, forced under pressure through runners into a mold to cover the first trace layer 451 and the first vertical connection layer 452, and subsequently cured to form solid mold compound layer 461.

At step 409, a grinding operation performed on the surface of the mold compound 461 exposes a surface of the vertical connection layer 452 and provides conductive surfaces for mounting devices, or for use in additional plating operations. If the multilayer package substrate is complete, the method ends at step 410, where a de-carrier operation removes the metal carrier 471 from the dielectric material 461, leaving the first trace layer 451 and the first vertical connection layer 452 in a dielectric material 461, providing a package substrate.

In examples where additional trace layers and additional vertical connection layers are needed, the method continues, leaving step 409 and transitioning to step 411 in FIG. 4B.

At step 411, a second trace layer 453 is formed by plating using the same processes as described above with respect to step 405. A seed layer for the plating operation is deposited and a photoresist layer is deposited and patterned, and the plating operation forms the second trace layer 453 over the mold compound 461, with portions of the second trace layer 453 electrically connected to the first vertical connection layer 452.

At step 413, a second vertical connection layer 454 is formed using an additional plating step on the second trace layer 453. The second vertical connection layer 454 can be plated using the second trace layer 453 as a seed layer, and without the need for removing the preceding photoresist layer, simplifying the process.

At step 415, a second molding operation is performed to cover the second trace layer 453 and the second vertical connection layer 454 in a layer of dielectric material 463. The multilayer package substrate at this stage has a first trace layer 451, a first vertical connection layer 452, a second trace layer 453, and a second vertical connection layer 454, portions of the layers are electrically connected together to form vertical paths through the mold compound layers 461 and 463.

At step 417, the mold compound layer 463 is mechanically ground in a grinding process or chemically etched to expose a surface of the second vertical connection layer 454. At step 419 the example method ends by removing the metal carrier 471, leaving a multilayer package substrate including the conductor layers 451, 452, 453 and 454 in dielectric layers 461, 463. The steps of FIGS. 4A-4B can be repeated to form multilayer package substrates for use with the arrangements having more layers, by performing plating of a trace layer, plating of a vertical connection layer, molding, and grinding, repeatedly.

Figure 5:
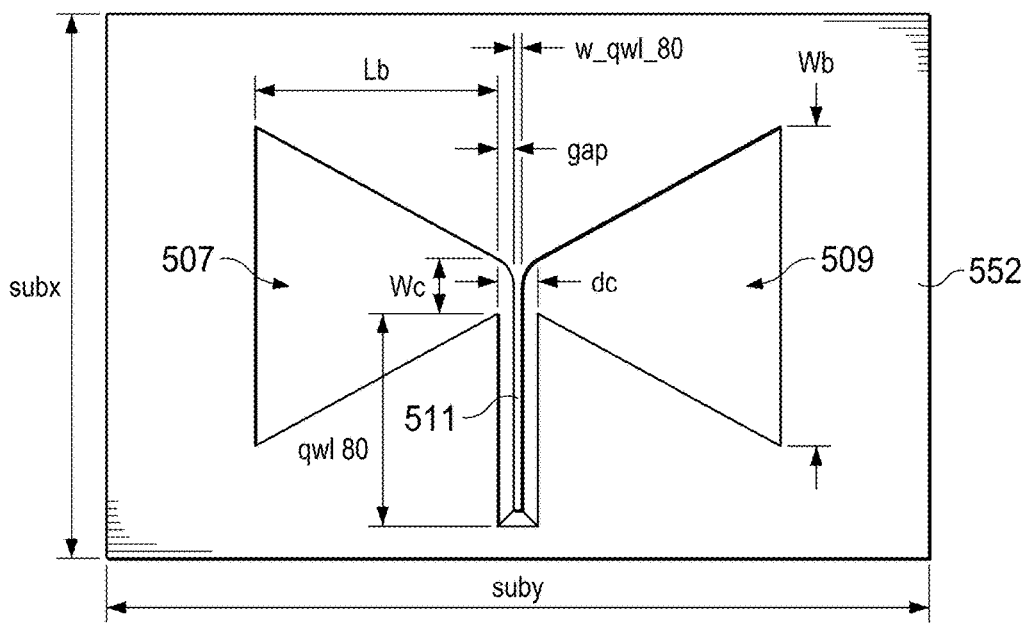
FIG. 5 illustrates, in a plan view, a bow tie antenna that can be used with the arrangements.

FIG. 5 illustrates, in a plan view, a bow-tie antenna for use with an arrangement. In FIG. 5, the bow tie antenna 508 is formed in a conductor layer 552, for example a copper or gold layer can be used. The conductor layer 552 can be formed as a layer on a multilayer package substrate, as shown in FIGS. 1A-1D. The example antenna arrangement 508 is configured for radiating signals in the rectangular waveguide WR5 range, between 140 and 220 GHz. In alternative arrangements, the antenna 508 can be varied in dimensions to configure the antenna for other frequency ranges, for example between 30 GHz and 300 GHz (millimeter wave range), and other radio frequency ranges.

As shown in FIG. 5, the antenna 508 has a bow tie pattern formed in the conductor layer 552 by forming bow shaped openings. The bowtie pattern includes two bows 507, 509 which face opposite directions from a feed portion 511 with two slots. In an example arrangement for a WR5 bandwidth antenna configured to operate between 140 and 220 GHz frequencies, the bow length, labeled Lb, was 0.62 millimeters, the bow width labeled Wb was 0.80 millimeters, the bow center width labeled Wc was 0.16 millimeters, the center distance dc was 0.1 millimeters, and the gap was 0.034 millimeters. The bow tie antenna in this example was formed on a rectangular copper conductor with an x dimension labeled subx of 1 millimeter and a y dimension labeled suby of 1.5 millimeters, a size that is useful on a multilayer package substrate. The feed portion 511 has a length qwl 80 and a width w_qwl_80, and a gap width. These distances can be varied with application and these distances can be determined in a simulation of the antenna design. Useful sizes for an example of the multilayer package substrate could be from 2 to 5 millimeters by 2 to 5 millimeters, for example. The size of the multilayer package substrate can be varied depending on the size and number of semiconductor devices mounted, as well as the antenna dimensions, so that the area of the device side surface is sufficient for mounting the semiconductor devices and the antenna spaced from the semiconductor devices. As frequencies increase, the wavelengths become compatible with microelectronics package sizes, for example millimeter wave signals between 30 and 300 GHz have wavelengths of between 10 and 1 millimeters. The antennas of the arrangements take advantage of these sizes. As frequencies increase and wavelengths correspondingly decrease, the size of the antenna may decrease, and the useful sizes of the multilayer package substrate may also decrease.

Figure 6:
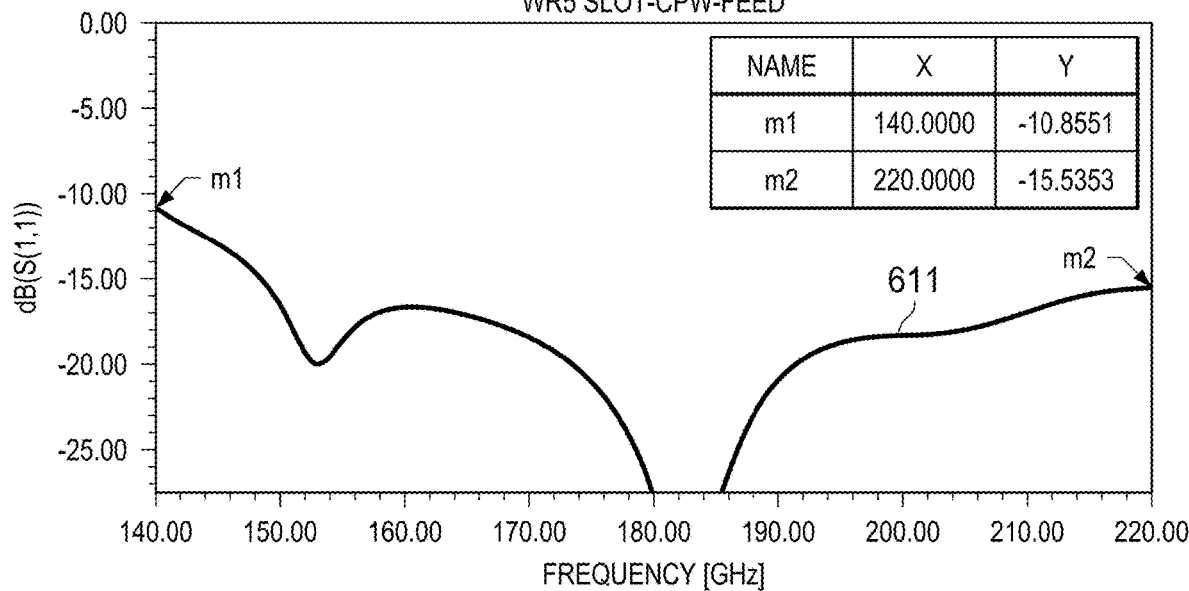
FIG. 6 illustrates, in a graph, an S parameter performance of an arrangement.

FIG. 6 illustrates, in a graph, a curve 611 illustrating the S11 parameters for the example antenna of FIG. 5, showing simulation results. As shown in FIG. 6, the S11 curve 611 is below −10 dB along the entire frequency range, indicating low reflection and good insertion performance for the antenna 508 in the WR5 frequency range. As shown in FIG. 6, the antenna has a reflection coefficient of less than −10 dB for the frequency range from 140 GHz to 220 GHz, indicating that greater than 90% of the power at the antenna will be radiated from the antenna over this range; indicating good antenna performance.

Figure 7A:
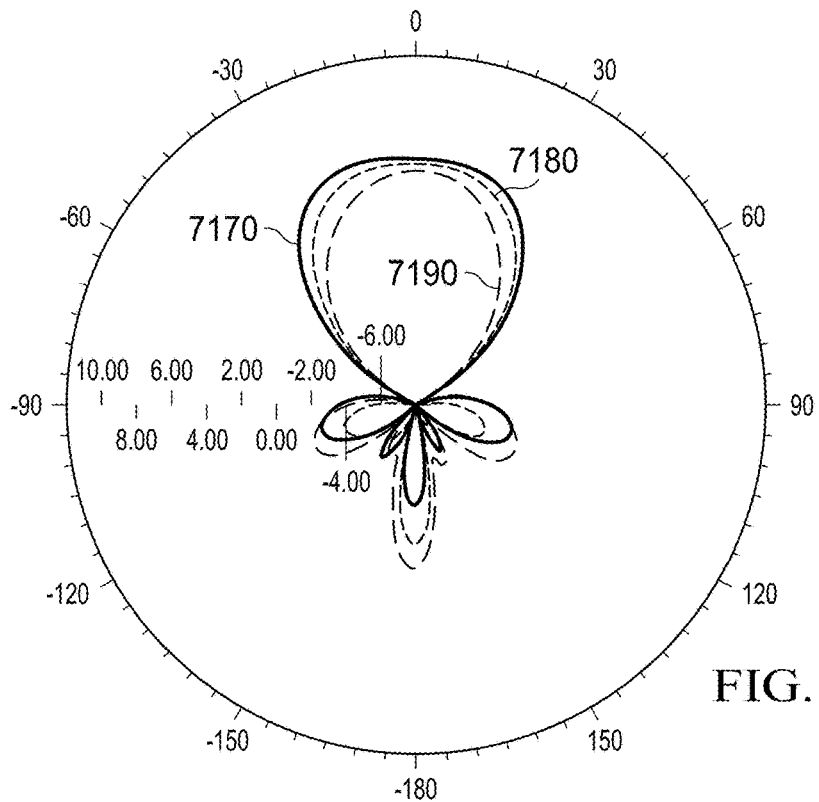
FIGS. 7A-7B illustrate, in graphs, the radiated field patterns of an antenna used in an arrangement.
Figure 7B:
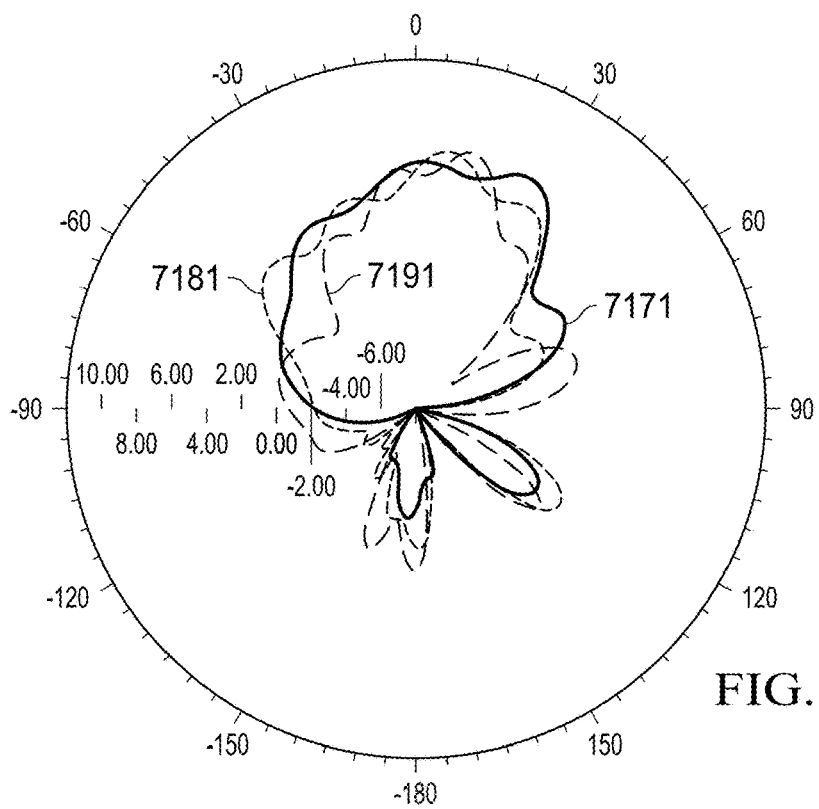

FIGS. 7A-7B are graphs of simulations showing a vertical radiation pattern, and a horizontal radiation pattern, respectively, for the example bowtie antenna of FIG. 5. As shown in FIG. 7A, using curves 7170, 7180 and 7190 for frequencies of 170, 180 and 190 GHz, the vertical radiation pattern of the antenna has a major lobe extending from the device upwards, as is desired for the arrangements. In FIG. 7B, for curves 7171, 7181, and 7191, frequencies of 170, 180 and 190 GHz, respectively, the radiation pattern has a major lobe extending away from the device in one direction, so that the radiation is directional; as is desired for the arrangement.

Figure 8:
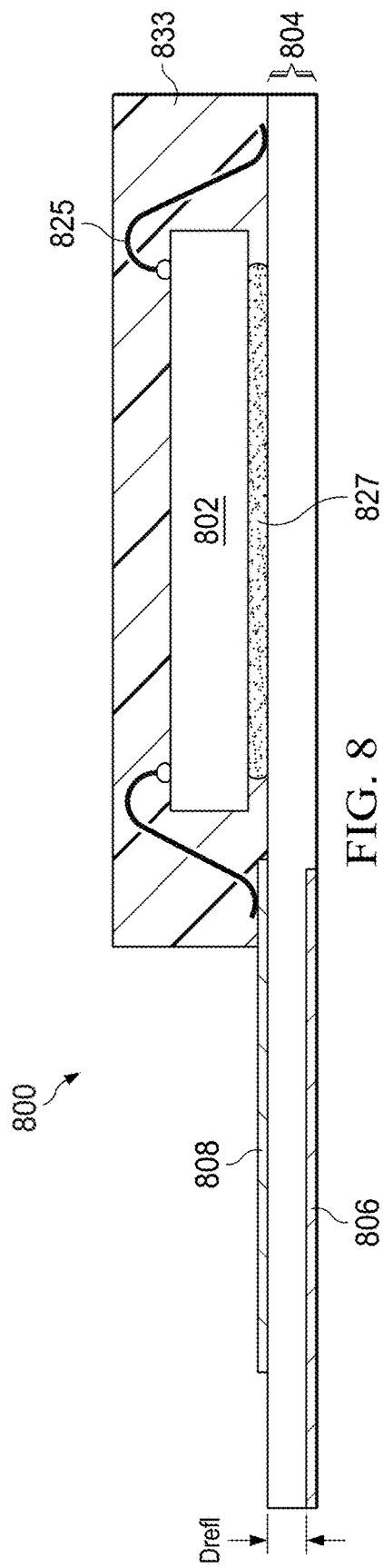
FIG. 8 illustrates, in a cross sectional view, an alternative arrangement.

FIG. 8 illustrates, in a cross sectional view, an arrangement for a microelectronic device package 841 having a wire bonded semiconductor die 802 mounted on a device side surface of a multilayer package substrate 804. The multilayer package substrate 804 has an antenna 808 formed on a device side surface and spaced from a device mounting portion where the semiconductor die 802 is attached. A die attach material 827 is used to mount the semiconductor die 802 in a face up orientation with bond pads facing away from the multilayer package substrate 804. The semiconductor die 802 is coupled to the multilayer package substrate 804 and the antenna 808 using wire bonds. A mold compound 833 is formed over the wire bonds 825 and the semiconductor die 802, but does not cover the antenna 808 in this example. In an alternative example the mold compound 833 can cover the antenna 808. The antenna 808 is formed in a conductor layer of the multilayer package substrate 804, and a reflector 806 is formed beneath the antenna 808 in another conductor layer in the multilayer package substrate 804, and at a spacing distance Drefl which is determined to provide constructive interference when signals are reflected back to the antenna 808 from reflector 806.

Figure 9:
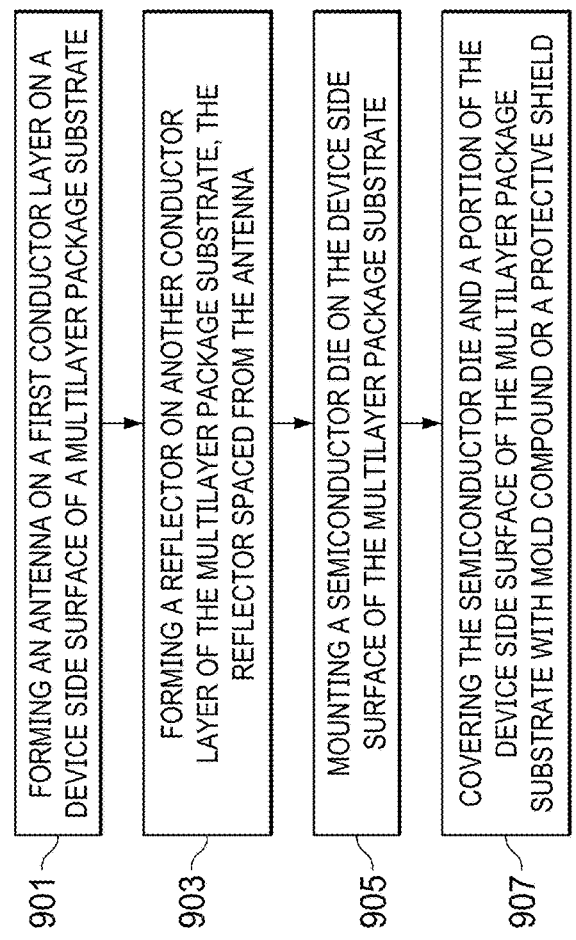
FIG. 9 illustrates, in a flow diagram, selected steps of a method for forming the arrangements.

FIG. 9 illustrates, in a flow diagram, steps for forming an arrangement. At step 901, an antenna is formed on a first conductor layer on a device side surface of a multilayer package substrate, see FIG. 1A for example, and the method of FIGS. 4A-4B. At step 903, a reflector is formed in another conductor layer of the multilayer package substrate spaced from the antenna. At step 905, a semiconductor die is mounted on the device side surface of the multilayer package substrate spaced from the antenna, see semiconductor die 102 and antenna 108 in FIG. 1A. At step 907, the semiconductor die and a portion of the device side surface of the multilayer package substrate are covered with mold compound or a shield. This is shown in FIGS. 1A-1C, 1E and 1F, see mold compound 103, 133. In some arrangements the mold compound also covers the antenna, see FIG. 1A, in other arrangements the antenna is exposed from the mold compound, see FIG. 1E for example.

The use of the arrangements provides a microelectronic device package with an integrated antenna and a semiconductor die. Existing materials and assembly tools are used to form the arrangements, and the arrangements are low in cost when compared to solutions using additional circuit boards or modules to carry the antennas. The arrangements are formed using existing methods, materials and tooling for making the devices and are cost effective.

Modifications are possible in the described arrangements, and other alternative arrangements are possible within the scope of the claims.

What is claimed is:

1. An apparatus, comprising:
a multilayer package substrate including a first conductor layer and a second conductor layer spaced by a dielectric material, the first conductor layer including a bowtie antenna and the second conductor layer including a reflector and leads of the apparatus;
a semiconductor die on the multilayer package substrate and electrically connected to at least one of the leads via a vertical connection layer; and
a mold compound covering the multilayer package substrate and the semiconductor die, wherein the first conductor layer and the second conductor layer are parallel to each other.

2. The apparatus of claim 1, wherein the bowtie antenna further comprises a first bow and a second bow formed as openings in the first conductor layer, the first bow and the second bow oriented to face in opposite directions, and a feed input comprising slots in the first conductor layer coupled to the first bow and the second bow.

3. The apparatus of claim 2, wherein the feed input is coupled to the semiconductor die.

4. The apparatus of claim 1, wherein the vertical connection layer is not a via.

5. The apparatus of claim 1, wherein the semiconductor die is flip chip mounted on the multilayer package substrate.

6. The apparatus of claim 1, wherein the apparatus is a quad flat no leads (QFN) device.

7. The apparatus of claim 1, wherein the multilayer package substrate further comprises dielectric material between the conductor layers that is acrylonitrile butadiene styrene (ABS), acrylonitrile styrene acrylate (ASA) or epoxy resin mold compound.

8. The apparatus of claim 1, wherein the conductor layers in the multilayer package substrate are of copper, gold, aluminum, silver or an alloy thereof.

9. The apparatus of claim 1, wherein the vertical connection layers in the multilayer package substrate are of copper, gold, aluminum, silver or an alloy thereof.

10. The apparatus of claim 1, wherein the bowtie antenna is configured to radiate signals at frequencies between 30 GHz and 300 GHz.

11. An apparatus, comprising:
a multilayer package substrate including an antenna and a reflector spaced by a dielectric material in between, a plane along a surface of the reflector and a plane along a surface of a lead of the apparatus being coplanar, the plane along the surface of the reflector and a plane along a surface of the antenna being parallel;
a semiconductor die on the multilayer package substrate and electrically connected to the lead via a vertical connection layer; and
a mold compound covering the multilayer package substrate and the semiconductor die.

12. The apparatus of claim 11, wherein a portion of the antenna is not covered by the mold compound.

13. The apparatus of claim 11, wherein the dielectric material includes one of acrylonitrile butadiene styrene (ABS), acrylonitrile styrene acrylate (ASA) and epoxy resin mold compound.

14. The apparatus of claim 11, wherein the antenna is configured to radiate signals at frequencies between 30 GHz and 300 GHz.

15. The apparatus of claim 11, wherein the semiconductor die is electrically connected to the lead via a vertical connection layer within the dielectric material.

16. The apparatus of claim 11, wherein the dielectric material contacts the lead.

17. The apparatus of claim 11, wherein the antenna and the reflector include one of copper, gold, aluminum, silver and an alloy thereof.

18. The apparatus of claim 11, wherein the semiconductor die is flip chip mounted to the multilayer package substrate, the semiconductor die having conductive post connects extending from the semiconductor die, the conductive post connects with a proximate end on a bond pad on the semiconductor die and extending to a distal end away from the semiconductor die, and having a solder bump on the distal end of the conductive post connects, the solder bumps forming bonds to the multilayer package substrate.

19. The apparatus of claim 11, wherein the semiconductor die is mounted to the package substrate using a die attach, and the semiconductor die coupled to the multilayer package substrate by wire bonds formed between the bond pads and the multilayer package substrate.

20. The apparatus of claim 11, wherein the antenna is a bowtie antenna.

* * * * *